US006842132B2

(12) United States Patent
Schafferer

(10) Patent No.: US 6,842,132 B2
(45) Date of Patent: Jan. 11, 2005

(54) CONSTANT SWITCHING FOR SIGNAL PROCESSING

(75) Inventor: Bernd Schafferer, Gloucester, MA (US)

(73) Assignee: Analog Devices, inc., Norwood, MA (US)

(*) Notice: Subject to any disclaimer, the term of this patent is extended or adjusted under 35 U.S.C. 154(b) by 0 days.

(21) Appl. No.: 10/351,470

(22) Filed: Jan. 24, 2003

(65) Prior Publication Data

US 2004/0145506 A1 Jul. 29, 2004

(51) Int. Cl.[7] .............................. H03M 1/00; H03M 1/66
(52) U.S. Cl. ...................................... 341/144; 341/136
(58) Field of Search ................................. 341/144, 118, 341/120, 136; 327/280, 382, 408

(56) References Cited

U.S. PATENT DOCUMENTS

| | | | | |
|---|---|---|---|---|
| 4,056,740 | A | | 11/1977 | Schoeff ........................ 307/362 |
| 5,148,065 | A | * | 9/1992 | Krenik et al. ................. 327/382 |
| 5,148,165 | A | | 9/1992 | Phillips ....................... 341/136 |
| 5,909,187 | A | | 6/1999 | Ahuja ......................... 341/136 |
| 6,344,816 | B1 | | 2/2002 | Dedic ......................... 341/144 |
| 6,377,197 | B1 | * | 4/2002 | Rantanen ..................... 341/118 |
| 6,466,072 | B1 | * | 10/2002 | Mar ........................... 327/280 |
| 6,507,304 | B1 | * | 1/2003 | Lorenz ........................ 341/144 |
| 6,608,578 | B2 | * | 8/2003 | Lee et al. ..................... 341/144 |
| 6,621,432 | B1 | * | 9/2003 | Ganci ......................... 341/136 |
| 6,621,438 | B1 | | 9/2003 | Hong .......................... 341/144 |
| 6,642,867 | B1 | * | 11/2003 | Chowdhury et al. ......... 341/118 |
| 6,720,898 | B1 | * | 4/2004 | Ostrem ........................ 341/144 |
| 2002/0190778 | A1 | | 12/2002 | Curry et al. ................. 327/408 |
| 2003/0043062 | A1 | | 3/2003 | Dedic et al. ................. 341/144 |

OTHER PUBLICATIONS

"Park S. et al. Digital–to–Analog Converter Based on Differential–Quad Switching", *IEEE Journal of Solid–State Circuits*, vol. 37, No. 10, Oct. 2002.

* cited by examiner

*Primary Examiner*—Patrick Wamsley
(74) *Attorney, Agent, or Firm*—Bromberg & Sunstein LLP

(57) ABSTRACT

Methods and devices for code independent switching in signal processing circuit such as a digital-to-analog converter (DAC) are described, which provide code independent switching activity. A steering cell receives a digital data input signal that is defined at data intervals, and produces multiple representative analog output signals. For each data interval, each analog output signal depends only on the present state of the digital data input signal, independently of any previous state of the digital data input signal. In addition, the signal processing circuit apart from the analog output signals is substantially free of data dependent disturbances.

26 Claims, 8 Drawing Sheets

CONSTANT SWITCHING FOR SIGNAL PROCESSING

FIELD OF THE INVENTION

The invention generally relates to electronic signal processing, and more specifically, to digital to analog signal conversion.

BACKGROUND ART

In electronic circuits, noise becomes an ever more limiting consideration as dynamic range increases and/or as minimum detectable signal decreases. One particular source of noise in a mixed digital and analog signal application is the effect on critical analog signal paths of the various digital signals (data and clocks). One commonly used such critical analog signal path is the switching or steering of analog reference signals by control elements, which are themselves activated by digital control signals. In a physically realizable system, it is impossible to completely isolate these digital control signals from the analog signals they are controlling because of coupling through the analog signal control elements, and also because digital circuits consume time-varying power and cause time-varying loading, IR drops, and charge injection, which in turn causes interactions with the overall signal processing circuit. These effects cause changes in reference signals, supply voltages, bias levels, clocking phases, transition phases, and substrate effects that in turn corrupt the desired analog signal being processed. Because of inevitable parasitics and non-ideal circuits, this can cause data dependant loading and spurious coupled signal modulation. In this manner the digital signals add noise and/or distortion to the analog signals.

One example of a signal processing circuit in which such considerations are relevant is a current steering digital-to-analog converter (DAC), which converts a digital data stream input into a corresponding analog signal output. FIG. 1 shows a portion of a typical one-bit current steering DAC cell 100 in which a digital data stream is applied to a synchronous digital output latch 101. In real world applications, considerable digital processing is involved in producing such a digital data stream, but in the context of a DAC, such preceding digital circuitry need not be described. When the latch 101 is clocked, the data present on the D-input is transferred to the Q output, and its complement is transferred to the Q-bar output. For multi-bit systems, multiple cells 100 are arranged in parallel so as to share a common output terminal arrangement.

The outputs of latch 101 control switch drivers 102, which in turn operate differential switch pair 103 that control a constant current source supplied from a common source node. For a given logic state present on the output of the latch 101, one switch of the switch pair 103 will be on, and the other will be off. When the logic state on the output latch 101 changes, the on-off states of the switches in switch pair 103 also change correspondingly. Whichever switch of the switch pair 103 is on provides a current path for a constant current source 104 through one of the analog output resistors 105 (which typically are part of a separate client application). Thus, an analog signal output signal is developed at output terminals 106.

In theory, such a current steering DAC 100 can operate at any frequency to provide an analog output corresponding to the digital data input. In the real world, errors and noise occur throughout the system, the effects of which increase with operating frequency. These effects may be code dependent and may result in distortion in the analog output signal.

One approach to reducing code dependent noise is presented by FIG. 8 of U.S. Pat. No. 6,344,816, which describes adding an additional clocked circuit called a "dummy latch" in parallel with the output latch 101. The output of the dummy latch is not itself used in any way, rather the dummy latch and the output latch 101 are connected and operated such that with every cycle of the clocking signal, one of the latches will change state and the other will not. Thus, if the output latch 101 changes state with the data signal, the dummy latch maintains its logic state, and if the output latch 101 maintains its logic state constant with an unchanging data signal then the dummy latch will change logic states. According to the '816 patent, this arrangement maintains a constant loading on the clocking signal that is independent of the data signal logic state. There is no suggestion in the '816 that its teaching might be extensible beyond its focus on the clocking signal.

SUMMARY OF THE INVENTION

Embodiments of the present invention are directed to methods and devices for providing code independent switching activity in a signal processing circuit. The signal processing circuit may be, for example, a digital to analog converter (DAC) such as a current steering DAC. By placing multiple elements in the data path that are matched for loading, it is possible to create topologies wherein the interference created by any of the mechanisms mentioned above will be identical from clock cycle to clock cycle, thereby removing any substantial data dependency from this interaction. This means that there will be no shifting of supply voltages and currents, reference signals, biases, charge injection, or substrate effects for frequencies at or below the Nyquist bandwidth with respect to the clock frequency, thereby removing this form of analog signal degradation.

In one specific embodiment, a steering cell receives a digital data input signal that is defined at data intervals, and produces multiple representative analog output signals. For each data interval, each analog output signal depends only on the present state of the digital data input signal, independently of any previous state of the digital data input signal. In addition, the signal processing circuit apart from the analog output signals is substantially free of data dependent disturbances.

In one specific embodiment, the steering cell includes four parallel switches, arranged into two switch pairs, each pair having a common source node, a first input node controlling a first drain node, and a second input node controlling a second drain node. In this arrangement: (i) the common source nodes of the switch pairs are coupled together, (ii) the first drain nodes of the switch pairs are coupled together, and (iii) the second drain nodes of the switch pairs are coupled together and separate from the first drain nodes.

In a further such embodiment, the digital data input signal is associated with a clocking signal that controls the data intervals, and the switches are operated in an interleaved switching manner such that: (i) during odd number cycles of the clocking signal, a first switch pair is representative of the digital data input signal and a second switch pair is off, and (ii) during even number cycles of the clocking signal, the first switch pair is off and the second switch pair is representative of the digital data input signal.

In another embodiment, the digital data signal is associated with a clocking signal that controls the data intervals, and the switches are operated in a double sampled switching manner such that: (i) when the clocking signal is logic high, a first switch pair is representative of the digital data input signal and a second switch pair is off, and (ii) when the clocking signal is logic low, the first switch pair is off and the second switch pair is representative of the digital data input signal.

An embodiment may include a cell decoder for each switch for generating a switch input node control signal responsive to the digital data input signal. The cell decoder may include a data masking block for masking the digital data input signal with respect to phase of a clocking signal, a data synchronizing block for synchronizing the masked digital data signal with the clocking signal, and a switch driver block for coupling the synchronized and masked digital data signal out as the switch input node control signal. The may use static or dynamic logic devices.

An embodiment may further include a current supply for providing a constant source of current to the steering cell wherein the current supply is substantially free of data dependent disturbances. A voltage supply may provide at least one constant voltage, wherein the voltage supply is substantially free of data dependent disturbances. A reference signal circuit may provide at least one reference signal, wherein the reference signal circuit is substantially free of data dependent disturbances. A circuit substrate may provide a physical circuit structure, wherein the circuit substrate is substantially free of data dependent disturbances.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

U.S. Pat. No. 6,344,816 only dealt with preventing code dependent noise in DAC clocking circuitry using a "dummy balanced" approach. Embodiments of the present invention adopt a "truly balanced" approach to avoid code dependent disturbances throughout a signal processing circuit, not just in the clocking circuitry. This involves designing circuit operation to utilize a constant amount of switching activity instead of tolerating code dependent switching activity. A truly balanced circuit extends the benefits of constant loading and balance from the clock lines (which was all that the dummy balancing of the '816 patent reached), to other circuit elements including analog power supplies, reference signal circuits, output terminals, and substrate. The combined effects of embodiments utilizing such a truly balanced approach allow for considerable relaxing in design requirements and complexity, simplifying the design and implementation of specific signal processing devices such as a DAC.

Figure 1:
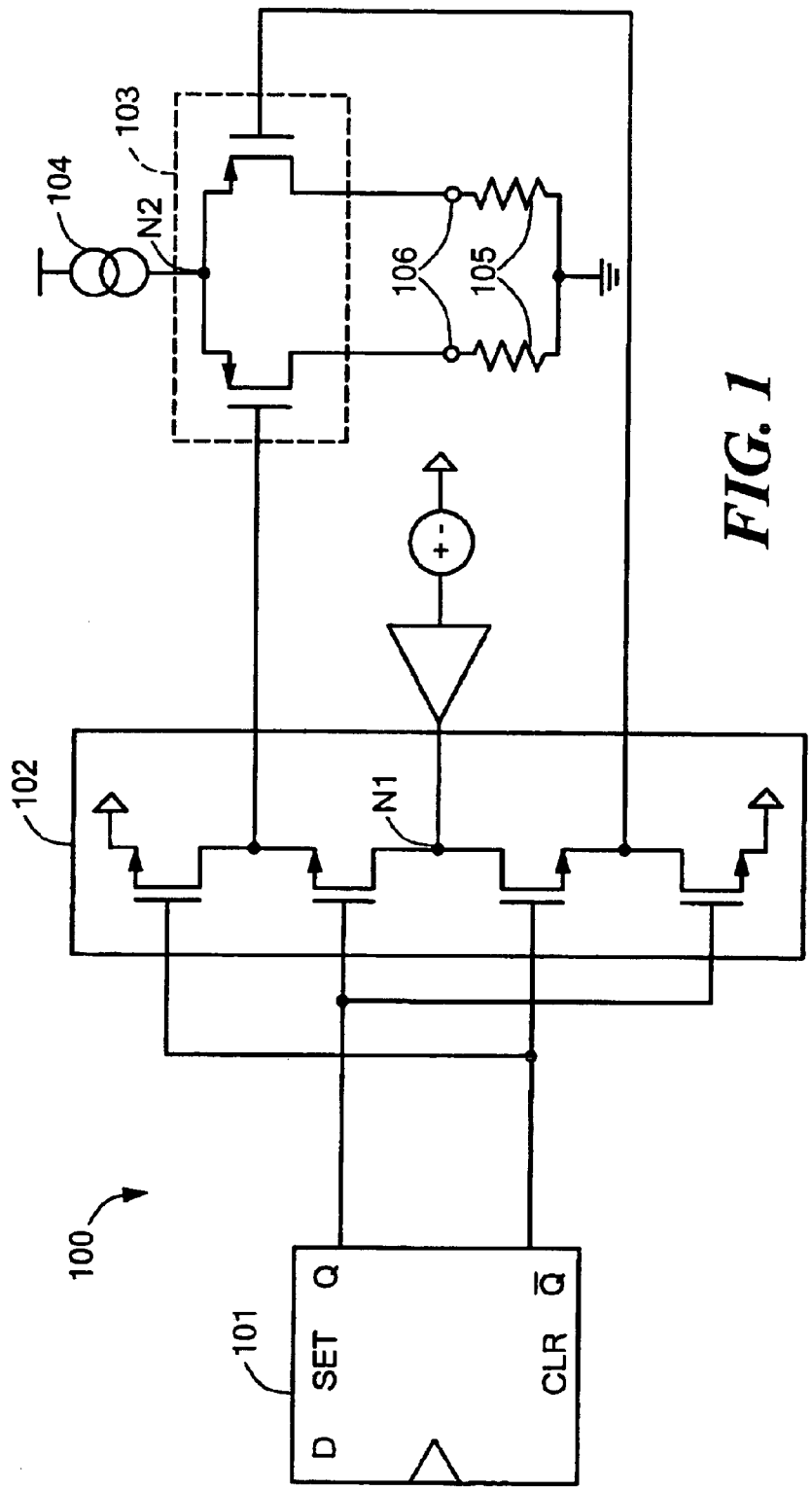
FIG. 1 shows a typical prior art current steering DAC.
Figure 2:
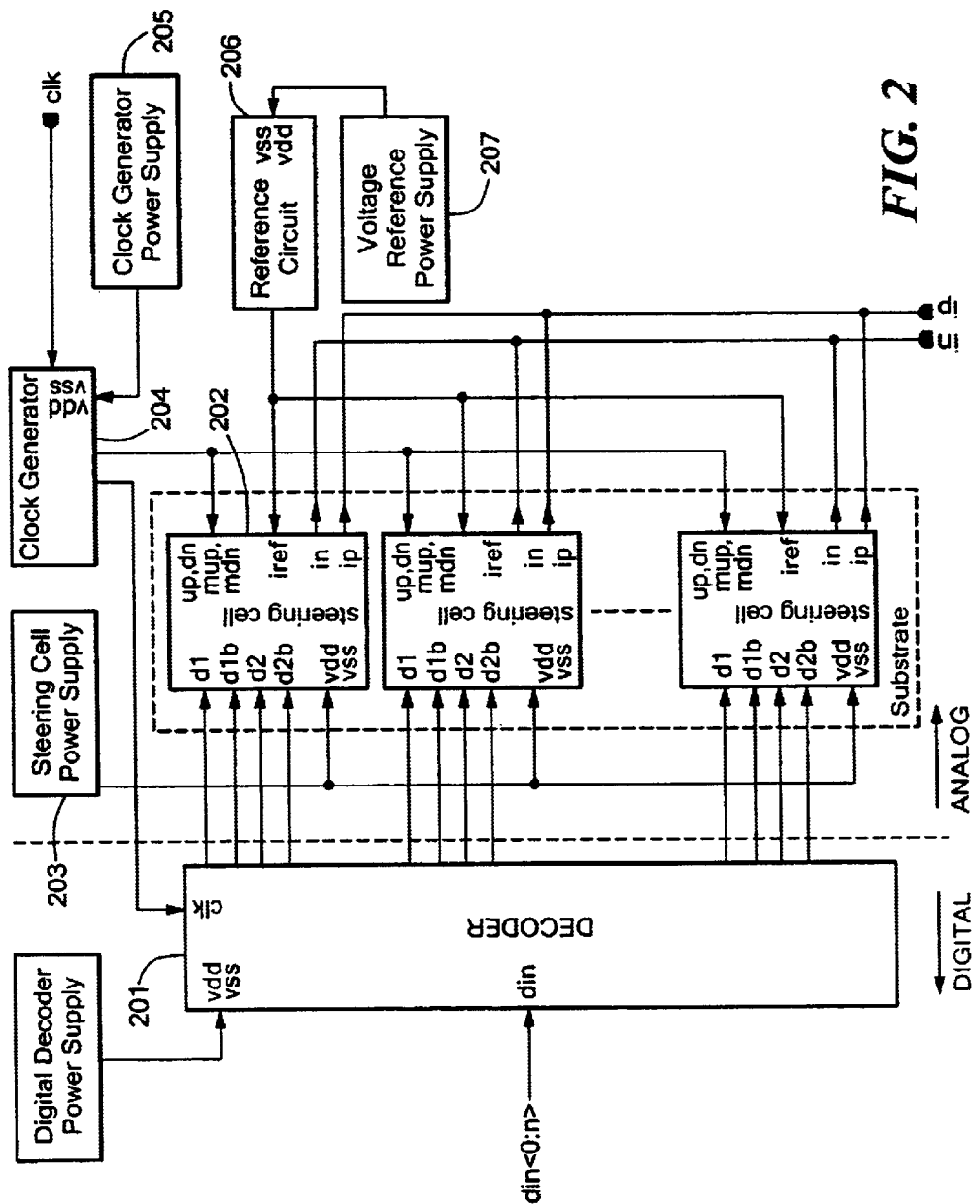
FIG. 2 shows a steering cell according to one embodiment of the present invention.

FIG. 2 shows broad functional blocks of a DAC according to one embodiment of the present invention. A steering cell 202 receives at least one digital data input signal that is defined at data intervals (for example, by one or more clocking signals such as those in FIG. 2—up, dn, mup, and mdn). The number of steering cells 202 can vary depending on the number of bits and segmentation of the DAC. In the case shown in FIG. 2, a digital decoder 201 produces two digital data signals d1 and d2, along with their respective complements d1$b$ and d2$b$, for each steering cell 202. Each steering cell 202 produces multiple analog output signals (in this case, in and ip) that are representative of the input digital data signal(s).

Switch cell power supply 203 produces supply voltages, shown as vdd and vss, which power each steering cell 202. Clock generator 204 (which has its own separate clock power supply 205) produces various clocking signals and masking signals needed by each steering cell 202: up, dn, mup, and mdn. Current reference circuit 206. (which has its own current ref power supply 207) produces current reference signal iref for the steering cells 202.

For each data interval, each analog output signal (in and ip) depends only on the present state of the digital data input signal(s), independently of any previous state of the digital data input signal(s). In addition, the signal processing circuit as a whole, apart from the analog output signals (e.g., blocks 201 and 203–207 and the circuit substrate), is substantially free of data dependent disturbances. Such operation counters the coupling of the steering cells 202 to each other over the various reference lines and supply lines, both individually by cell-to-cell interaction, and as a sum of all of the cells together as a whole. Similar cell-to-cell and sum of the cells interaction is also coupled into the device substrate. The effects of code dependent switching disturbances in prior art devices required that considerable design attention be devoted to minimizing cell interactions on the reference supply lines and in the substrate. Because the loading of the supply blocks and reference blocks by the steering cells 202 is data independent, embodiments of the present invention allow a considerable relaxation of this design requirement.

Figure 3:
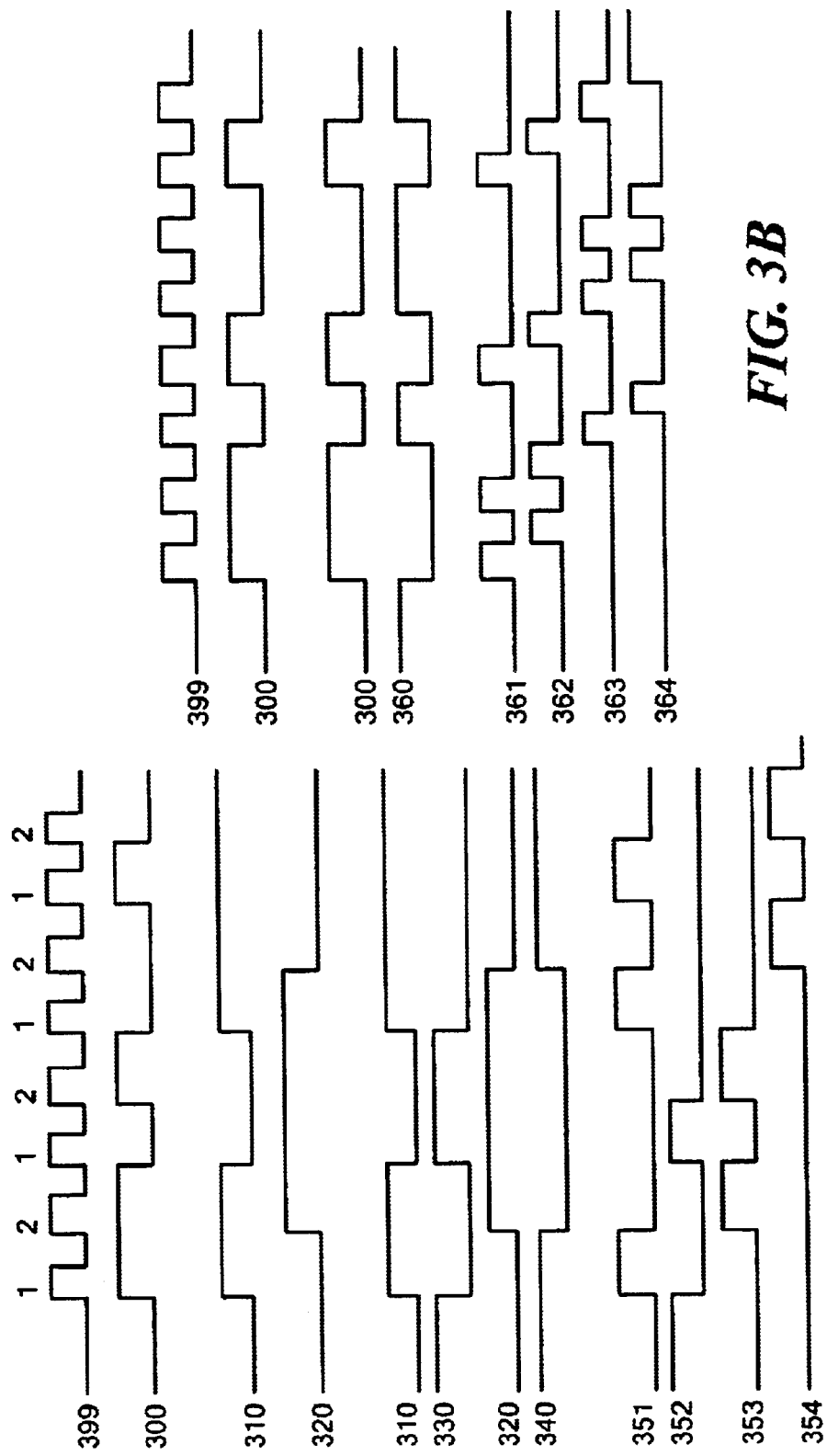
FIGS. 3A and 3B show various associated waveforms for the steering cell in FIG. 2.

Code independent operation of the circuit of FIG. 2 is illustrated by the waveforms shown in FIG. 3, in which FIG. 3A shows an interleaved switching approach, and FIG. 3B shows a double sampling switching approach. In both parts, waveform 399 is the clocking signal and 300 is the digital data signal. In the interleaved switching scheme shown in FIG. 3A, data signal 300 is split into two interleaved phases d1 310 and d2 320, which also have complementary signals d1$b$ 330 and d2$b$ 340. In such an embodiment, a return to zero rule is implemented when each data phase is inactive so that during odd number clock cycles, when d1 and d1$b$ are active, d2 and d2$b$ are returned to zero, forming signals 353 and 354 respectively. During even number clock cycles when d2 and d2$b$ are active, d1 and d1$b$ are returned to zero, forming signals 351 and 352 respectively. Together, waveforms 351–354 are equivalent representation to data signal 300, but the number of up and down edges during each clock cycle is constant and independent of the data.

The double sampling approach of FIG. 3B does not use two data phases, but rather a complementary data signal 360, and then masks data signal 300 and complementary data signal 360 with the clock. Thus, data signal 300 is masked with clock 399 to form 361, the complementary data signal 360 is masked with clock 399 to form 363, the data signal 300 is masked with the inverse of clock 399 to form 362, the complementary data signal 360 is masked with the inverse of clock 399 to form 364. Together waveforms 361–364 are equivalent to data signal 300, but with the same number of up and down edges during each clock cycle, independent of the data.

Figure 4:
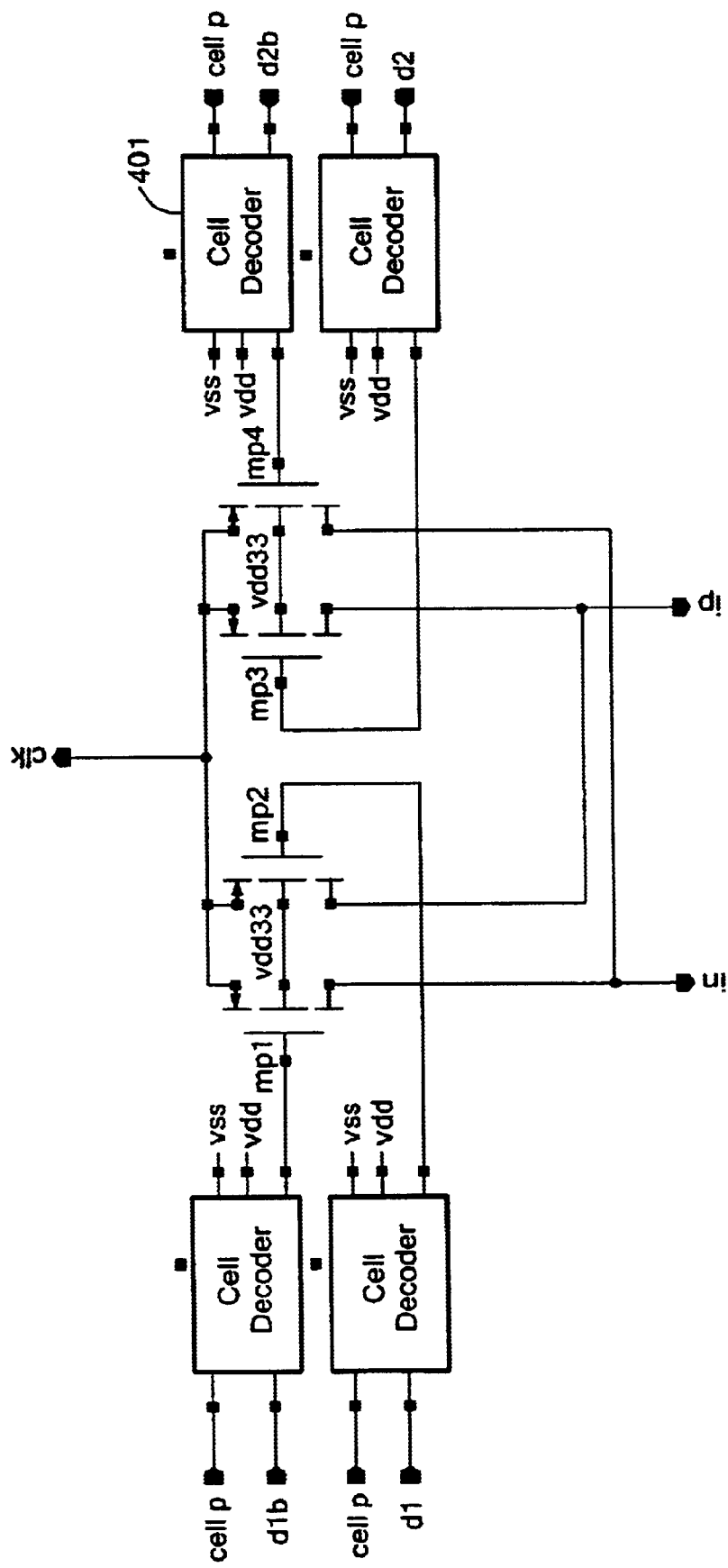
FIG. 4 shows the basic structure of an individual steering cell according to one specific embodiment of the present invention.

FIG. 4 shows one specific embodiment of the FIG. 3B switching waveforms in a DAC switching cell in which four switches are arranged so that at every state change of the clock, one of the switches will turn on and one will turn off. All four of the switches are used to develop the analog output signal at output terminals in and ip. The embodiment shown in FIG. 4 uses double sample switching in which the PHASE 1 differential output switch is formed by a first switch pair, mp1 and mp2, and the PHASE 2 differential output switch is formed by a second switch pair, mp3 and mp4.

Gate drive signals for each of these current switches mp1–mp4 are generated by individual cell decode 401 logic blocks. Data signals d1, d1b, d2, and d2b 300–360 are input to the cell decode blocks 401. In FIG. 4, d2 and d2b are essentially the same signals as d1 and d1b, but for practical reasons, d2 and d2b are delayed in order to meet setup and hold times of the cell decoders. The gate drive signal outputs correspond to the returned to zero signals 361–364. Of course, in other specific embodiments, generation of the gate drive signals may be integrated into just one or two logic blocks.

Figure 5:
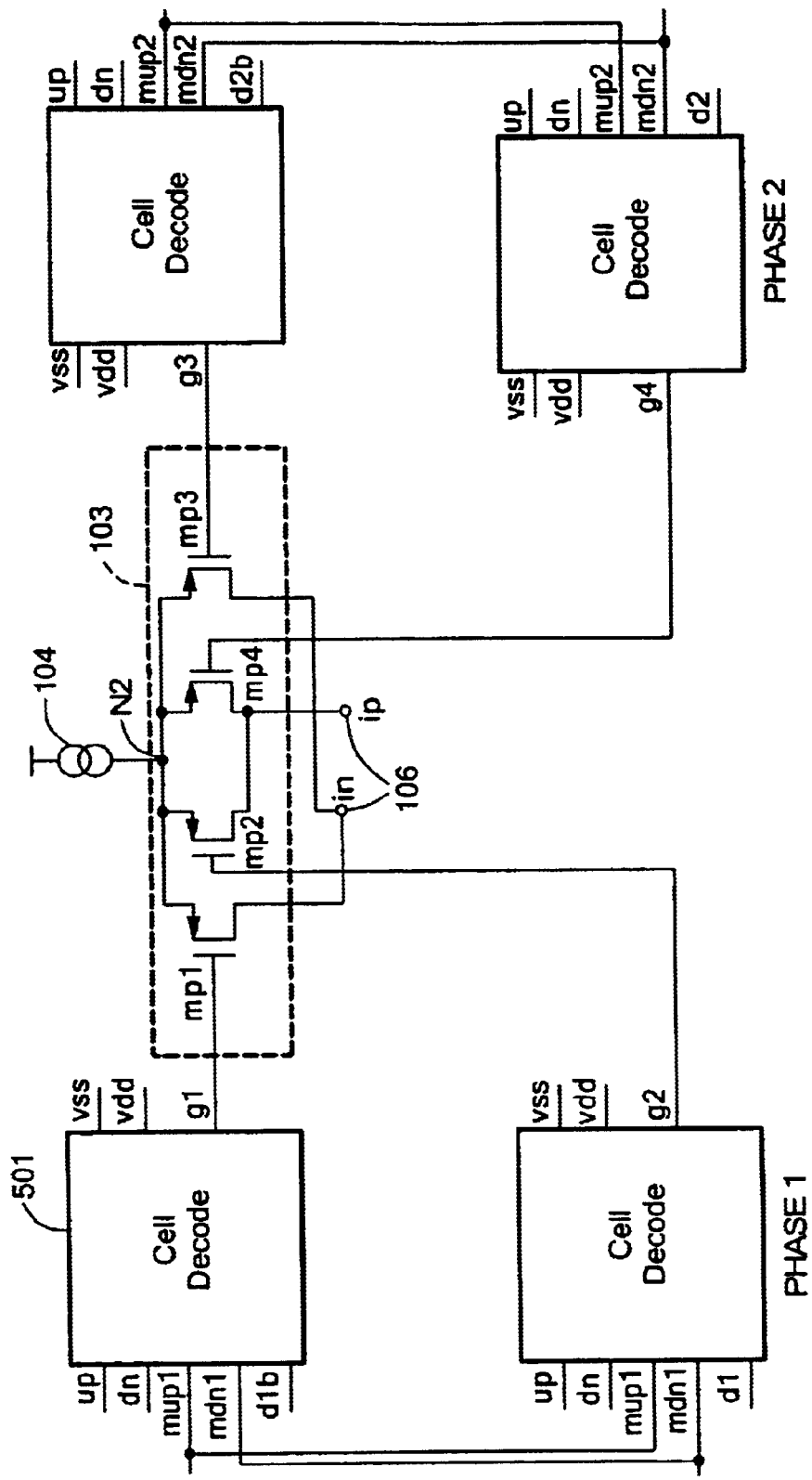
FIG. 5 shows an individual steering cell according to another specific embodiment of the present invention.

FIG. 5 is an alternative embodiment of an interleaved switching DAC switching cell which is consistent with the system of FIG. 2 in utilizing four clocking signals. Again, mp1 and mp2 form a first switch pair, and mp3 and mp4 form a second switch pair. Timing information for the switches is provided by the lines labeled up (defines when current switches mp1–mp4 are turned on) and dn (defines when current switches mp1–mp4 are turned off). Both phases use the same up and dn signals. Mask information signals mup1, mdn1, mup2, and mdn2 are used to block data going to cell decode 501 logic blocks when the opposite phase signal is active—e.g., in PHASE 1, mup2 and mdn2 block the up and dn signals going to the cell decode 501 blocks for the PHASE 2 switching elements mp3 and mp4 by making sure that their respect gate signals g3 and g4 stay at logic HIGH.

In the embodiment shown in FIG. 5, only one of the gate signals g1–g4 is LOW at a time, and the mask signals mup1, mdn1, mup2, and mdn2 define which phase is currently active. The data signals—d1 and d1b in PHASE 1, and d2 and d2b in PHASE 2—define to which output terminals 106 (in and ip) the output current is steered. Thus, every clocking cycle, exactly one of the current switches mp1–mp4 turns on and exactly one turns off.

Figure 6:
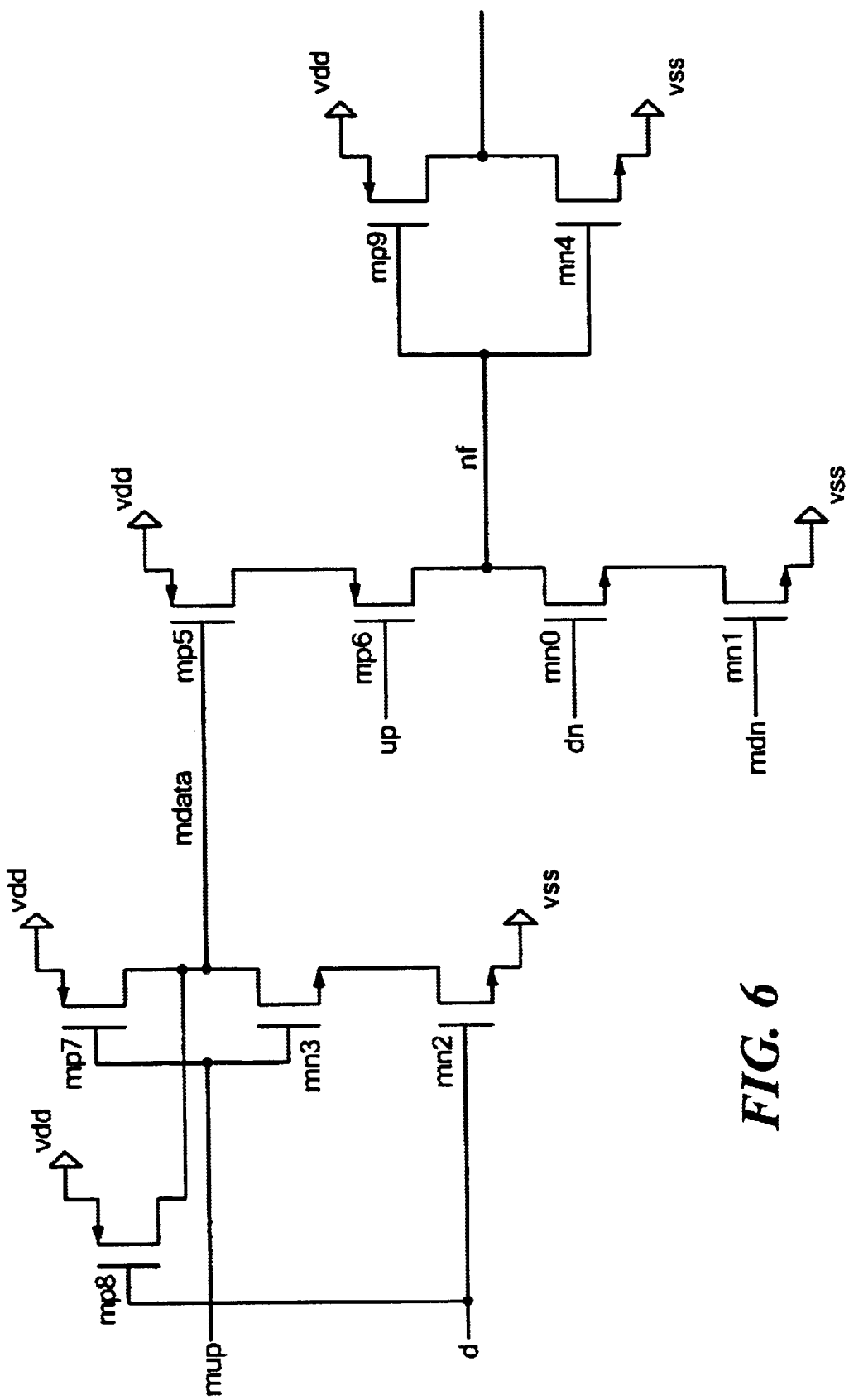
FIG. 6 is a schematic of the cell decode logical block in FIG. 5, according to one specific embodiment.

FIG. 6 shows details of one specific embodiment of the decode cell 501 depicted in FIG. 5. The four switching elements on the left side, mp8, mp7, mn3, and mn2, form a NAND gate with a default state of HIGH (mdata), which functions as a data masking block in which the data input d is masked out for different clock phases. Multiple specific implementations are possible to accomplish this function, including without limitation use of static or dynamic logic, and use of flip-flips or monostable latches. The data masking function is implemented in the cell decoder block 501 for timing reasons in this specific embodiment, but it could equally be performed in another separate logical block, such as in the digital decode block (201).

The mdata output of the data masking functional block is applied to a masked data synchronizing block, specifically, the gate of mp5 as the mask signal for the up pulse, where the mup signal latches the data. The mask signal for the dn pulse is mdn. The output nf of the switch stack, mp5, mp6, mn0, and mn1, is a dynamic node that stores the value set by the masked up or dn pulse. As with the previous functional block, the masked data synchronizing functional block can be implemented in a variety of specific ways—static or dynamic logic, flip-flops or monostables—so long as the masked data signal is effectively synchronized to the timing information carried by the clocking signal.

Switches mp9 and mn4 form an inverting buffer switch driver block that drives the gates of the current switches. The driver block acts to decrease load on the clock reference line and to decouple switch controlling signals (node out) from node nf. The falling edge of nf is defined by the rising edge of dn, while the rising edge of nf is defined by the falling edge of up. To avoid cross-currents, the mup signal of the corresponding phase should be LOW while the data signals change state. The generation of the up and dn signals is described in further detail in co-pending U.S. patent application Ser. No. 10/217,842, "Control Loop For Minimal Tailnode Excursion Of Differential Switches," and U.S. patent application Ser. No. 10/217,681, "Differential Clock Receiver With Adjustable Output Crossing Point," which are incorporated herein by reference.

Figure 7:
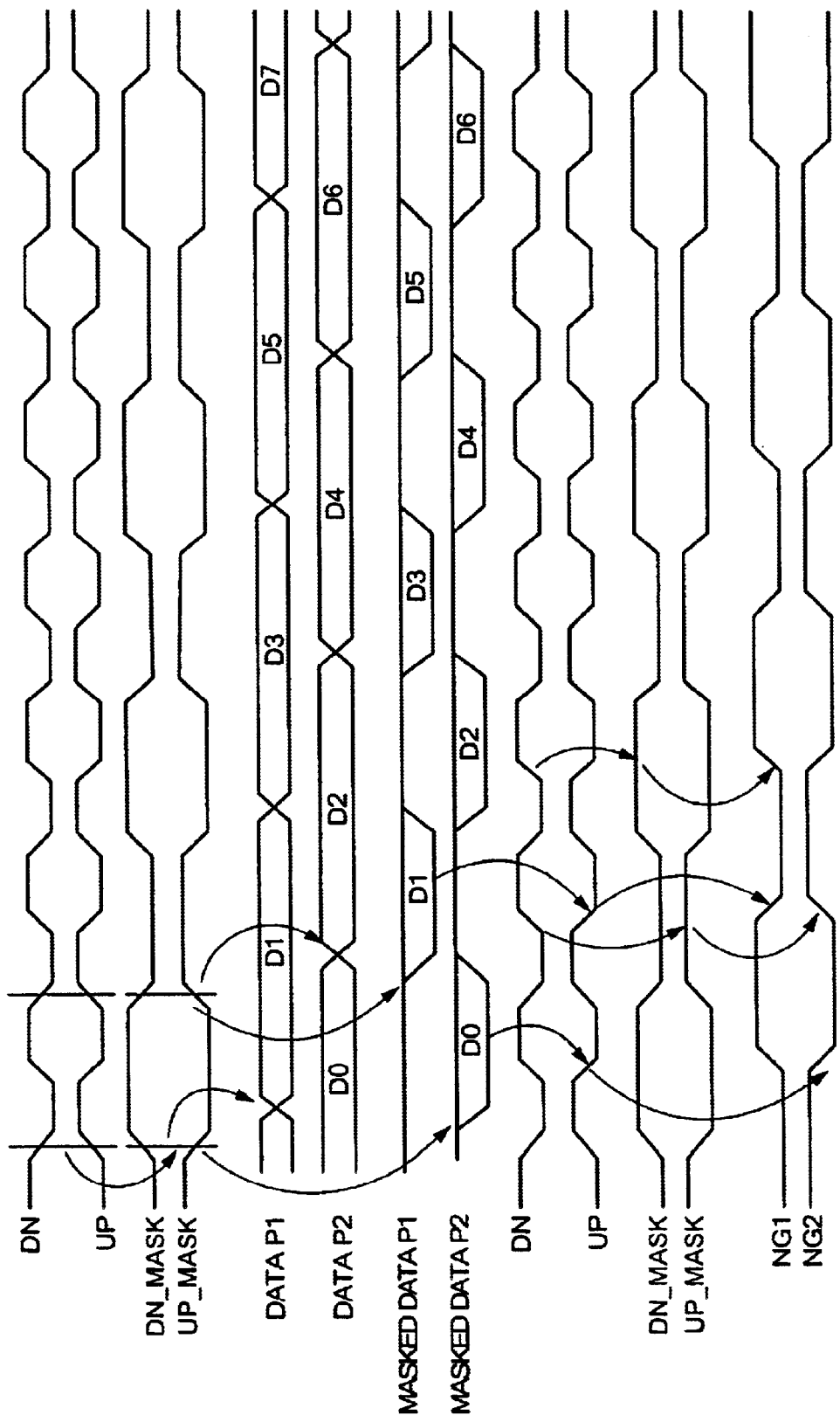
FIG. 7 shows various waveforms associated with the embodiment depicted in FIG. 5.

Depending on required performance levels and the design limits of the DAC, some of the functional blocks in a cell decoder could be merged together. For example, the switch driver section may not be necessary in some applications, or the clock timing information could be provided by a signal which runs at half the clock rate, avoiding the synchronizing functional block. FIG. 7 shows various waveforms of the signals associated with the specific embodiments shown in FIGS. 5 and 6.

Figure 8:
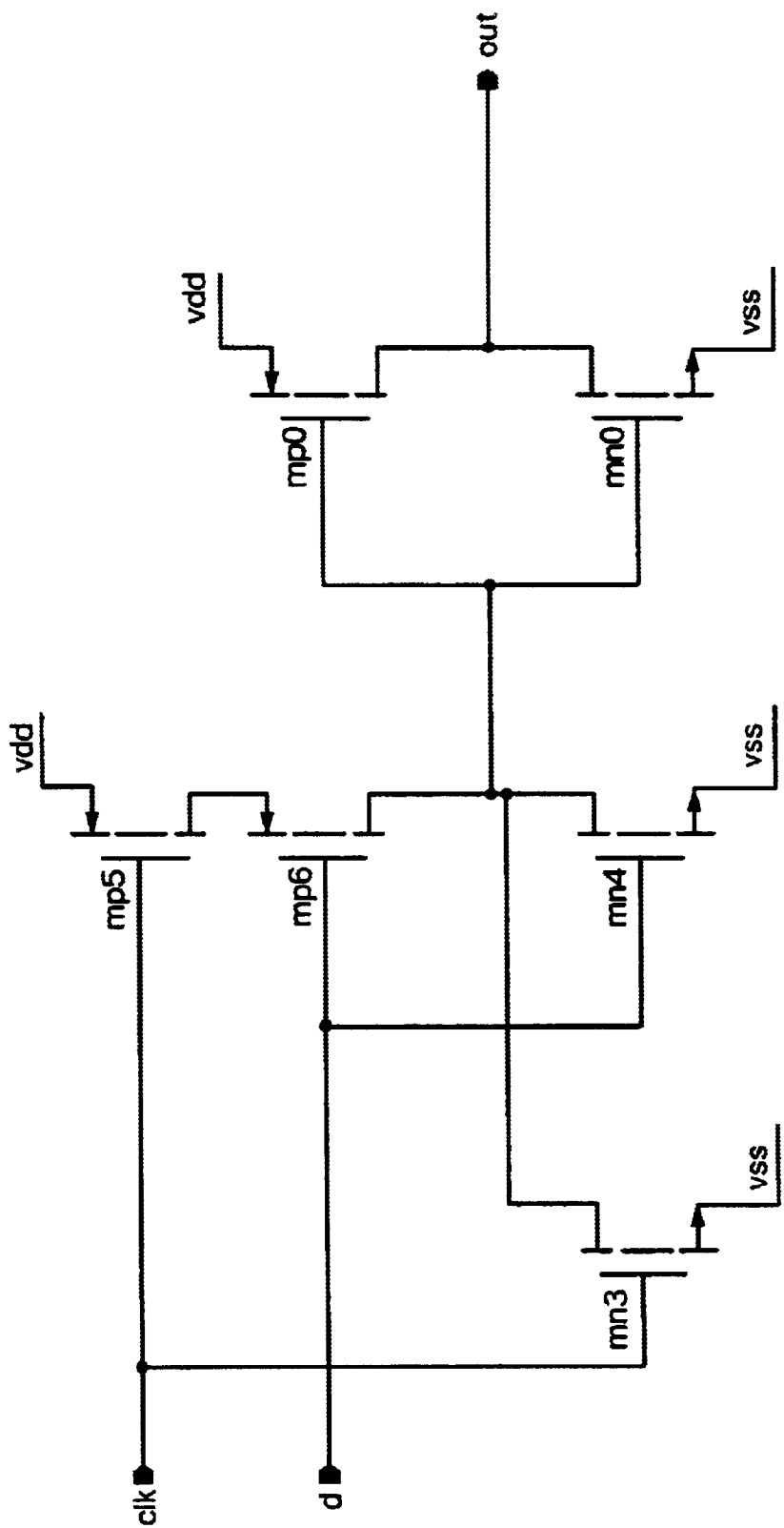
FIG. 8 shows a cell decode logic schematic for a double sampling waveform scheme according to FIG. 3B.

FIG. 8 shows specific details for a cell decoder block using a double sampling waveform scheme as shown in FIG. 3B. Data signal d is masked and synchronized with clock signal clk by mn3, mp5, mp6, and mn4. Switch drivers mp0 and mn0 couple the clock masked data signal out to the switching cell.

As explained above, embodiments of the present invention advantageously affect operation of a DAC by providing constant data switching with each clock cycle and data independency for the analog power supplies internal to the DAC (e.g., 203, 205, and 207 in FIG. 2). Thus, the design of these power supplies is relaxed in terms of source resistance and decoupling capacitance, and in some embodiments, the various separate analog power supplies can be combined into a single circuit. The constant data switching and resulting data independency also is reflected in the data independent loading on the DAC clock generator circuit 204. And signal disturbances on the reference circuitry (e.g., current reference circuit 206) and circuit substrate are also constant during the clock cycle and independent of the data signal, reducing the amount shielding required for the substrate and relaxing the driving capability requirements of the reference signal generator.

In addition, there is constant data switching during the clock cycle and data independency for disturbances at the common source node (N2) supplying current to the switch pair. There are two specific mechanisms that cause such disturbances at the common source node: (1) gate charge coupling via parasitic capacitances of the switch elements, and (2) charge accumulation or depletion due to improper change of conduction state of switches resulting from imperfect switch timing of the switch control signals. Both of these mechanisms also see constant switching and data independency due to embodiments of the present invention. Furthermore, any coupling of switch control signals via circuit capacitances to output terminals also will see constant data switching and data independency.

In addition, embodiments using the interleaved switching scheme of FIG. 3A allow the design of the digital decoder and the signal processing circuitry preceding it to be relaxed in some aspects since these circuits will be running at half the data rate.

Although various exemplary embodiments of the invention have been disclosed, it should be apparent to those skilled in the art that various changes and modifications can be made which will achieve some of the advantages of the invention without departing from the true scope of the invention. For example, embodiments could be implemented with P-MOS or bi-polar switches. Other implementation details could also be altered in a specific embodiment of the invention.

What is claimed is:

1. A signal processing circuit comprising:
    a steering cell having a digital data input signal defined at data intervals, and producing a plurality of representative analog output signals;
    wherein for each data interval, each analog output signal substantially depends only on the present state of the digital data input signal, independently of any previous state of the digital data input signal, and
    wherein the signal processing circuit apart from the analog output signals is substantially free of data dependent disturbances.

2. A signal processing circuit according to claim 1, wherein the steering cell further comprises:
    four parallel switches, arranged into two switch pairs, each pair having a common source node, a first input node controlling a first drain node, and a second input node controlling a second drain node; wherein:
    i. the common source nodes of the switch pairs are coupled together,
    ii. the first drain nodes of the switch pairs are coupled together, and
    iii. the second drain nodes of the switch pairs are coupled together and separate from the first drain nodes.

3. A signal processing circuit according to claim 2, further comprising:
    a cell decoder for each switch for generating a switch input node control signal responsive to the digital data input signal.

4. A signal processing circuit according to claim 3, wherein the cell decoder includes at least one of:
    a data masking block for masking the digital data input signal with respect to phase of a clocking signal,
    a data synchronizing block for synchronizing the masked digital data signal with the clocking signal, and
    a switch driver block for coupling the synchronized and masked digital data signal out as the switch input node control signal.

5. A signal processing circuit according to claim 3, wherein the cell decoder uses static logic devices.

6. A signal processing circuit according to claim 3, wherein the cell decoder uses dynamic logic devices.

7. A signal processing circuit according to claim 2, wherein the digital data input signal is associated with a clocking signal that controls the data intervals, and the switches are operated in a double sampled switching manner such that:
    i. when the clocking signal is logic high, a first switch pair is representative of the digital data input signal and a second switch pair is off, and
    ii. when the clocking signal is logic low, the first switch pair is off and the second switch pair is representative of the digital data input signal.

8. A signal processing circuit according to claim 1, wherein the signal processing circuit is a digital to analog converter (DAC).

9. A signal processing circuit according to claim 8, wherein the DAC is a current steering DAC.

10. A signal processing circuit according to claim 1, further comprising:
    a current supply for providing a constant source of current to the steering cell, wherein the current supply is substantially free of data dependent disturbances.

11. A signal processing circuit according to claim 1, further comprising:
    a voltage supply for providing at least one constant voltage, wherein the voltage supply is substantially free of data dependent disturbances.

12. A signal processing circuit according to claim 1, further comprising:
    a reference signal circuit for providing at least one reference signal, wherein the reference signal circuit is substantially free of data dependent disturbances.

13. A signal processing circuit according to claim 1, further comprising:
    a circuit substrate for providing a physical circuit structure, wherein the circuit substrate is substantially free of data dependent disturbances.

14. A method of signal processing in a circuit, the method comprising:
    developing a plurality of analog output signals representative of a digital data input signal defined at data intervals,
    wherein for each data interval, each analog output signal substantially depends only on the present state of the digital data input signal, independently of any previous state of the digital data input signal, and
    wherein the circuit apart from the analog output signals is substantially free of data dependent disturbances.

15. A method according to claim 14, wherein the developing a plurality of analog output signals uses four parallel switches, arranged into two switch pairs, each pair having a common source node, a first input node controlling a first drain node, and a second input node controlling a second drain node; wherein:
    i. the common source nodes of the switch pairs are coupled together,
    ii. the first drain nodes of the switch pairs are coupled together, and
    iii. the second drain nodes of the switch pairs are coupled together and separate from the first drian nodes.

16. A method according to claim 15, further comprising:
    generating for each switch a switch input node control signal responsive to the digital data input signal.

17. A method according to claim 16, wherein the generating step includes:
    masking the digital data input signal with respect to phase of a clocking signal, synchronizing the masked digital data signal with the clocking signal, and coupling the synchronized and masked digital data signal out as the switch input node control signal.

18. A method according to claim 16, wherein the generating step uses static logic devices.

19. A method according to claim 16, wherein the generating step uses dynamic logic devices.

20. A method according to claim 15, wherein the digital data signal is associated with a clocking signal that controls the data intervals, and the switches are operated in a double sampled switching manner such that:
  i. when the clocking signal is logic high, a first switch pair is representative of the digital data input signal and a second switch pair is off, and
  ii. when the clocking signal is logic low, the first switch pair is off and the second switch pair is representative of the digital data input signal.

21. A method according to claim 14, wherein the circuit is a digital to analog converter (DAC).

22. A method according to claim 21, wherein the DAC is a current steering DAC.

23. A method according to claim 14, further comprising:

providing to the steering cell a constant source of current substantially free of data dependent disturbances.

24. A method according to claim 14, further comprising:

providing at least one constant voltage substantially free of data dependent disturbances.

25. A method according to claim 14, further comprising:

providing at least one reference signal substantially free of data dependent disturbances.

26. A method according to claim 14, further comprising:

providing a physical circuit structure substantially free of data dependent disturbances.

* * * * *